United States Patent [19]

Lakhani et al.

[11] Patent Number: 4,679,311
[45] Date of Patent: Jul. 14, 1987

[54] METHOD OF FABRICATING SELF-ALIGNED FIELD-EFFECT TRANSISTOR HAVING T-SHAPED GATE ELECTRODE, SUB-MICRON GATE LENGTH AND VARIABLE DRAIN TO GATE SPACING

[75] Inventors: Amir A. Lakhani; Laurence C. Olver, both of Columbia, Md.

[73] Assignee: Allied Corporation, Morristown, N.J.

[21] Appl. No.: 808,597

[22] Filed: Dec. 12, 1985

[51] Int. Cl.$^4$ .................. H01L 21/283; H01L 21/308
[52] U.S. Cl. ........................... 29/579; 29/591; 148/DIG. 143; 357/15; 427/90
[58] Field of Search ............... 29/579, 591; 156/649, 156/665; 427/89, 90

[56] References Cited

U.S. PATENT DOCUMENTS

| 4,048,646 | 9/1977 | Ogawa et al. | 357/15 |
| 4,472,872 | 9/1984 | Toyada et al. | 29/571 |
| 4,529,686 | 7/1985 | Kraus | 430/314 |

FOREIGN PATENT DOCUMENTS 53-35481 1/1978 Japan.
5773975 10/1980 Japan.
9144175 8/1984 Japan.

Primary Examiner—Olik Chaudhuri
Attorney, Agent, or Firm—J. R. Ignatowski; R. M. Trepp

[57] ABSTRACT

A method of fabricating a self-aligned field-effect transistor having a T-shaped gate electrode and a sub-micron gate length. In the method of the present invention, a multi-layer gate structure is formed on an active region formed in a semiconductor substrate. A first aluminum layer of the gate structure, which is adjacent to the active region, is selectively etched to form a T-shaped gate electrode. The etching provides the first layer of the gate electrode with a gate length of less than 0.75 microns, and the T-shaped gate electrode is used as a shadow-mask to deposit self-aligned source and drain electrodes.

13 Claims, 8 Drawing Figures

METHOD OF FABRICATING SELF-ALIGNED FIELD-EFFECT TRANSISTOR HAVING T-SHAPED GATE ELECTRODE, SUB-MICRON GATE LENGTH AND VARIABLE DRAIN TO GATE SPACING

CROSS REFERENCE TO RELATED APPLICATION

Cross Reference is made to U.S. application Ser. No. 808,599, filed Dec. 12, 1985, entitled, "Dual-Gate MESFET Having Inter-Gate Layer" by A. A. Lakhani and L. C. Olver, the inventors herein and assigned to the assignee herein, which is directed to a dual-gate metal-semiconductor field effect transistor (MESFET) having first and second T-shaped gate electrodes and an intergate layer to lower inter-gate resistance.

BACKGROUND OF THE INVENTION

1. Field of the Invention

The present invention relates to a method of fabricating a high performance metal semiconductor field-effect transistor (MESFET), and more particularly, to a method of fabricating a MESFET having a T-shaped gate electrode with a sub-micron gate length, and source and drain electrodes which are self-aligned with the gate electrode.

2. Description of the Related Art

The benefits of sub-micron geometries in MESFETs are known in the art. Generally, device geometries below 1 micron are obtained by using techniques such as electron beam lithography and angle-evaporation, as discussed by Imai et al. in "A Sub-Half-Micron-Gate Length GaAs MESFET With New Gate Structure," IEEE Electron Device Letters, Vol. EDL-4, No. 4, p. 99 (1983). Electron beam lithography techniques, however, require expensive equipment which may not otherwise be required, and angleevaporation techniques suffer from low yield and throughput. A technique for producing sub-micron gate lengths by undercutting a multi-layered gate structure using chemical etching is disclosed in an article entitled "GaAs power Field-Effect Transistors for K-band Operation," by Taylor et al., RCA Review, Vol. 42, p. 508 (1981). While the work described by Taylor et al. does result in sub-micron gate lengths, it does not produce MESFETs having source and drain electrodes which are self-aligned with the gate electrodes ("self-aligned MESFETs"). The full potential of sub-micron geometry MESFETs cannot be exploited if the devices are not self-aligned.

To obtain self-aligned MESFETs, "T-shaped" structures have been used as shadow masks. Self-aligned techniques employing T-shaped structures are disclosed by Buiatti in U.S. Pat. No. 4,048,712, Umebachi et al. in U.S. Pat. No. 4,075,652, and Levy et al. in an article entitled "Self-Aligned Submicron Gate Digital GaAs Integrated Circuits," IEEE Electron Device Letters, Vol. EDL-4, No. 4, p. 102 (1983).

The T-shaped mask disclosed by Levy et al. is used as a shadow-mask for ion implantation. Thus, the fabrication of the T-shaped gate structure is necessarily followed by the high temperature annealing which must be performed after ion implantation. Accordingly, the gate metal must be one which will not react with the underlying substrate during the high temperature annealing, and one which has a relatively low vapor pressure so that it does not evaporate during the annealing process.

In both Buiatti and Umebachi et al. the T-shaped structures are fabricated by forming a first layer, of a material which is to be etched, over the entire surface of the semiconductor device. An etching resistant layer or layers, or a mask, is formed on a portion of the first layer. (In Buiatti the first layer becomes a gate electrode and the second layer is a mask which is ultimately removed. In Umebachi et al the various layers all become part of the gate electrode). Then etching is performed to remove the portions of the first layer which are not protected by the etching resistant layer. At the same time, the portion of the first layer which is protected by the etching resistant layer or mask is under-etched to form a T-shaped structure.

The above method of fabricating a T-shaped structure, however, does not produce a well defined gete structure. In particular, since under-etching, or lateral etching, of the first layer takes place at the same rate as the vertical etching of the first layer, the first layer which remains after etching, is much narrower at the top than at the bottom. Specifically, since lateral etching of the bottom of the first layer does not begin to occur until almost the entire thickness of the first layer has been etched, lateral etching at the bottom of the first layer does not progress very far past the edge of the etching resistant layer or mask. Thus, the chance of shorting between the gate electrode and self-aligned source and drain electrodes is always present when the gate electrode is formed in this manner. Furthermore, since lateral etching of the top of the first layer continues during almost the entire etching process, the first layer which remains after etching is much narrower at the top than at the bottom, so that it is almost triangular in crosssection.

In the case of Umebachi et al., the etching resistant layer remains after the etching is completed to become the upper, or wider, portion of the T-shaped gate electrode. As a result, the narrowness of the top of the first layer of the T-shaped structure creates increased resistivity and greatly decreases the structural stability of the gate electrode. In the case of Buiatti, where the etching resistant mask is removed, the top of the gate electrode is very narrow. Therefore, it is extremely difficult to form gate electrode contacts or to form further gate layers, and the gate electrode has an increased resistivity. Importantly, since the etching resistant layer or mask is formed by normal photolithography which cannot produce sub-micron dimensions, and since etching of the bottom of the first layer of the T-shaped structure does not progress very far past (under) the edge of the mask, it is extremely difficult to produce sub-micron gate geometries using methods such as those disclosed by Buiatti and Umebachi et al.

It is apparent, from the foregoing, that there is a need in the art for a method of fabricating MESFETs having sub-micron gate lengths and self-aligned source and drain contacts.

SUMMARY OF THE INVENTION

An object of the present invention is to provide a method of fabricating high performance MESFETs having sub-micron gate lengths, self-aligned source and drain contacts, and variable source to drain spacing.

A further object of the present invention is to provide a method of fabricating a MESFET including a T-shaped gate electrode having a low gate resistance and reduced parasitic channel resistance between the drain and gate and between the source and the gate.

A still further object of the present invention is to provide a method of fabricating a MESFET having an increased breakdown voltage provided by an increased drain to gate spacing.

In a first embodiment of the present invention a multi-layer gate structure is formed on a surface of an active region formed in a semiconductor substrate. A first layer of the gate structure, which is adjacent to the active region, is selectively etched to form a T-shaped gate electrode. The etching also provides the first layer of the resultant gate electrode with a sub-micron gate length. The T-shaped gate electrode is then used as a shadow mask to deposit self-aligned source and drain electrodes. The source to gate distance and the drain to gate distance may be varied by forming the source and drain electrodes using angle-deposition techniques.

In a second embodiment of the present invention, a highly doped semiconductor layer is formed in the active region and a mask is utilized to etch through a portion fo the highly doped semiconductor layer and then to deposit a multi-layer gate structure on the active region. The selective etching of the first layer of the gate structure to form a T-shaped gate electrode and the deposition of self-aligned source and drain electrodes are performed in the same manner as in the first embodiment.

The fabrication method of the present invention has advantages over the prior art in that only two masks are required and the method can be applied to fabricate MESFETs in any orientation without regard to isotropic etching rate in single crystals of semiconductor material. MESFETs fabricated in accordance with the method of the present invention have a T-shaped gate electrode which has low gate resistance, and the self-aligned structure reduces parasitic channel resistance between the source and gate and between the drain and gate. Moreover, MESFETs having an unequal source to gate and drain to gate spacing, which is desired for high quality MESFETs, may be easily fabricated. In addition, the method of the present invention is applicable to forming self-aligned elements in any heterojunction semiconductor device.

DESCRIPTION OF THE PREFERRED EMBODIMENTS

Figure 1A:
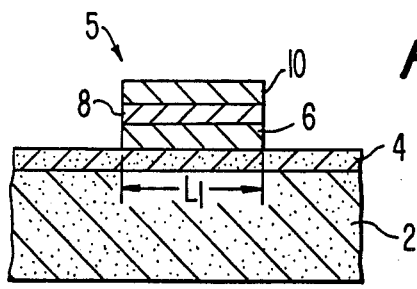
FIGS. 1A-1D are cross-sectional views showing the steps of fabricating a semiconductor device in accordance with the first embodiment of the method of the present invention and a variation thereof.

A method of forming a MESFET according to a first embodiment of the present invention will be described with reference to FIGS. 1A-1D. As shown in FIG. 1A, a semiconductor substrate 2 has an active region 4 formed therein. Gallium arsenide (GaAs) is the most widely used substrate for MESFETs; however, it is to be understood that the method of the present invention is applicable to MESFETs formed on substrates comprising any suitable group III-V compound semiconductor. In particular, indium phosphide (InP), gallium aluminum arsenide (GaAlAs), and gallium phosphide (GaP) are all suitable materials for the substrate 2. The active region 4 may be formed by conventional methods such as ion implantation followed by annealing, or by epitaxial growth if the active region 4 can be lattice matched with the substrate 2. The substrate 2 may be the supporting structure for a plurality of devices, and thus the individual devices are electrically isolated by implanting isolation regions (not shown) in the substrate 2 and the active region 4, or mesa etching (not shown).

Figure 1B:
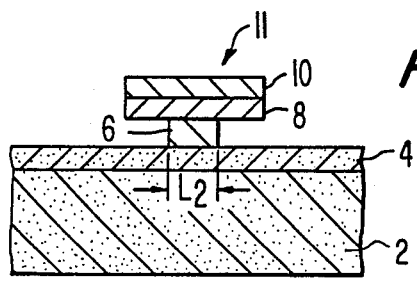

A gate mask (not shown) having a gate window is formed on the active region 4 by a standard lift-off technique. The gate mask is used to deposit a multi-layer gate structure 5 comprising a first layer 6 formed on the active region 4, and at least a second layer 8 formed on the first layer 6. A third layer 10, as well as further layers (not shown), may be formed on the second layer 8. The first layer 6 of the multi-layer gate structure 5 is then selectively etched to form a T-shaped gate electrode 11, as shown in FIG. 1B. If the T-shaped gate electrode 11 is formed by selective etching, it is necessary to select a combination of two or more layers for the gate structure 5 for which an etchant can be identified to selectively etch the first layer 6.

The preferred materials for the various layers of the gate structure 5 are an aluminum (Al) first layer 6, a titanium (Ti) second layer 8, and a platinum (Pt) third layer 10. The Al/Ti/Pt structure is selected because sodium hydroxide (NaOH) will selectively etch the aluminum first layer 6, and because aluminum is a well characterized material for a Schottky gate. The Al/Ti/Pt structure is also desirable because it provides a low gate resistance. It would be possible to employ a two layer gate structure comprising an Al first layer 6 and a Ti second layer 8, but Ti oxidizes, is difficult to bond to, and has a high resistivity. The use of a Pt layer eliminates the problems associated with Ti, but Pt reacts with Al. Thus the Al/Ti/Pt structure is employed, with the Ti layer forming a barrier between the Al and Pt layers.

The gate length $L_1$ of the gate structure 5 is approximately 1 micron. A submicron gate length $L_2$, shown in FIG. 1B, of the first layer, or lower portion, of the T-shaped gate electrode 11, is achieved by controlled undercutting during the etching process. The gate length $L_2$ is less than 0.75 microns. The preferred thicknesses of the various layers of the gate structure 5 are as follows: the first layer 6 has a minimum thickness of approximately 3000 Å and is generally less than 5000 Å; and, in the Al/Ti/Pt structure of the preferred embodiment, the second layer 8 has a thickness of at least 1000 Å and the third layer 10 has a thickness of more than 1000 Å. The thickness of the second and third layers 8 and 10 (or the second layer 8 if only two layers are employed) is selected so that the T-shaped gate electrode 11 is structurally stable and so that the gate electrode 11 has a low resistance.

In the case of the Al/Ti/Pt structure of the preferred embodiment, etching is performed using diluted NaOH. The NaOH is diluted with deionized water in a ratio of 40 parts water to one part NaOH, and etching is performed for approximately 15 seconds. After etching, the device is immediately rinsed in deionized water.

Figure 1C:
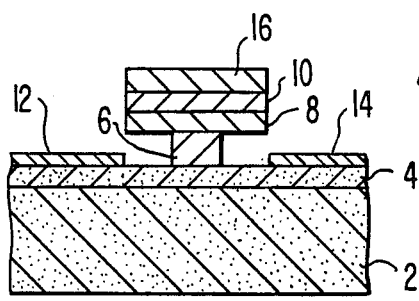

Source and drain electrodes, or contact regions, 12 and 14, shown in FIG. 1C, are deposited using the T-shaped gate electrode 11 as a shadow mask, thereby self-aligning the source and drain electrodes 12 and 14 and the T-shaped gate electrode 11. The preferred material for the source and drain electrodes 12 and 14 is a gold-germanium-nickel (AuGeNi) alloy which is also deposited on the T-shaped gate electrode 11 to form a gate electrode contact layer 16. The gate electrode contact layer 16 provides a further reduction in the gate resistance, in addition to the reduced gate resistance provided by the T-shaped gate electrode 11. Then, the device is annealed at a temperature between 370° and 450° C. for approximately one minute to form ohmic contacts between the source and drain electrodes 12 and 14 and the active region 4, and between the T-shaped gate electrode 11 and the gate electrode contact region 16. Annealing can be performed in a hydrogen ($H_2$) or nitrogen ($N_2$) atmosphere. The source and drain electrodes 12 and 14 are formed with a thickness of approximately 1500 Å. Thus, the minimum thickness of 3000 Å for the first layer 6 of the T-shaped gate electrode 11 is necessary so that the source and drain electrodes 12 and 14 do not contact the T-shaped gate electrode 11. The source and drain electrodes 12 and 14 may be deposited using conventional deposition methods; for example, electron beam evaporation or sputtering.

Figure 1D:
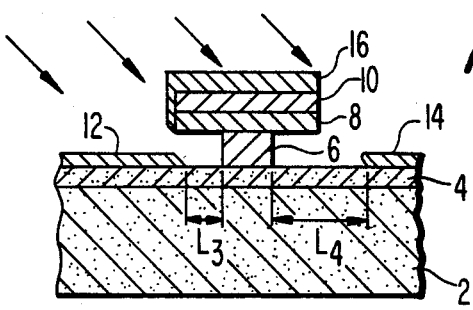

A variation of the first embodiment of the present invention will be described with reference to FIG. 1D. In the variation of the first embodiment the source and drain electrodes 12 and 14, as well as the gate electrode contact layer 16, are formed by an angle-deposition technique. Varying the angle at which the deposition is performed allows the distance $L_3$ between the source electrode 12 and the gate electrode 11 and the distance $L_4$ between the drain electrode 14 and the gate electrode 11 to be adjusted. Unequal spacings between the respective source and drain electrodes 12 and 14 and the gate electrode 11 are automatically provided when the T-shaped gate electrode 11 is utilized as a shadow-mask during an angle deposition. In high quality MESFETs, it is desirable to have a larger distance $L_4$ between the drain electrode 14 and the gate electrode 11 than the distance $L_3$ between the source electrode 12 and the gate electrode 11. This unequal spacing improves performance by increasing the breakdown voltage of the device, the breakdown voltage being dependent on the distance $L_4$ between the drain electrode 14 and the gate electrode 11 because the potential difference between the drain electrode 14 and the gate electrode 11 is usually on the order of two times as large as the potential difference between the source electrode 12 and the gate electrode 11.

Figure 2A:
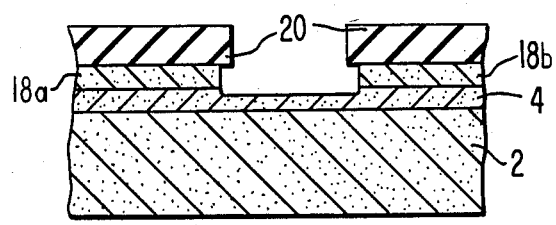
FIGS. 2A-2D are cross-sectional views showing the steps of fabricating a semiconductor device in accordance with the second embodiment of the method of the present invention.
Figure 2B:
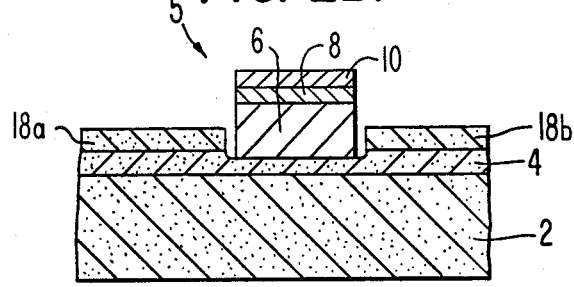

A method of fabricating a MESFET in accordance with a second embodiment of the present invention will be described with reference to FIGS. 2A-2D. The primary difference between the methods of the first and second embodiments of the present invention is the formation, in the second embodiment, of a highly doped layer. The highly doped layer is formed in the active region 4 by ion implantation, or on the active region 4 by epitaxial growth. If the highly doped layer is formed by ion implantation, the active region 4 and the highly doped layer are sequentially implanted and only one annealing is required. As with the first embodiment of the present invention isolation regions (not shown) are formed after the completion of the fabrication of the action region 4 and the highly doped layer. Then, a first mask 20 is deposited on the highly doped layer and patterned to have a gate opening. Thereafter, etching is performed to remove the portion of the highly doped layer corresponding to the position of the gate opening in the mask 20, thereby dividing the highly doped layer into source and drain regions 18a and 18b, and 100-200 Å of the active region 4. The etching process also underetches the mask 20, as shown in FIG. 2A. The etchant may comprise sulfuric acid, deionized water, and hydrogen peroxide in a ratio of approximately 100:5:1, yielding an etching rate of approximately 100 Å/min. A multi-layer gate structure 5, shown in FIG. 2B, is then deposited on the active region 4 through the gate opening in the mask 20, and the mask 20 is removed.

Figure 2C:
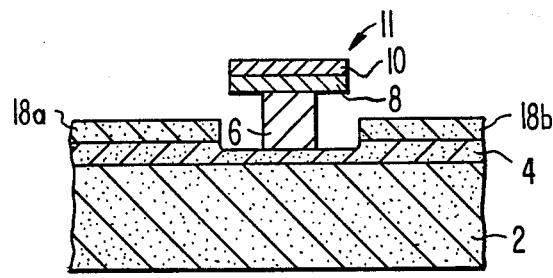
Figure 2D:
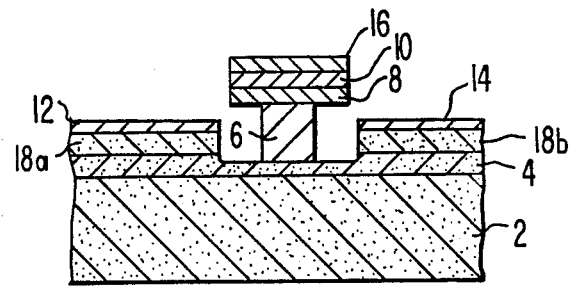

With reference to FIG. 2C, the gate structure 5 is etched to form a T-shaped gate electrode 11 in the same manner as the method of the first embodiment of the present invention. Due to the formation of the source and drain regions 18a and 18b, it may be desirable to increase the thickness of the first layer 6 of the T-shaped gate electrode 11. The deposition of the source and drain electrodes 12 and 14 and the gate electrode contact layer 16 is performed in the same manenr as in the first embodiment of the present invention.

The many features and advantages of a self-aligned MESFET having a sub-micron gate length will be apparent to those skilled in the art from the detailed specification. Further, since numerous modifications and changes will readily occur to those skilled in the art, the claims are intended to cover all suitable modifications and equivalents falling within the true spirit and scope of the invention.

What is claimed is:

1. A method of fabricating a self-aligned semiconductor device on a substrate having an active region formed therein, comprising the steps of:
   (a) forming a multi-layer gate structure on the active region, said gate structure having an aluminum layer contacting said active region, a titanium layer disposed on said aluminum layer and a platinum layer disposed on said titanium layer;
   (b) selectively etching said aluminum layer to form a gate electrode having a T-shaped cross-section; and
   (c) forming source and drain electrodes on the active region using the T-shaped gate electrode as a shadow mask so that the source and drain electrodes are aligned with the gate electrode.

2. A method according to claim 1, wherein said step (c) comprises forming the source and drain electrodes by angle deposition using the T-shaped gate electrode as a shadow-mask so that the distance between the drain electrode and the gate electrode is greater than the distance between the source electrode and the gate electrode.

3. A method according to claim 1, wherein said aluminum layer is formed having a thickness of approximately 4000 Å, said titanium layer is formed having a thickness of at least 1000 Å, and said platinum layer is formed having a thickness of at least 1000 Å.

4. A method according to claim 1, wherein said source and drain electrodes are AuGeNi alloy.

5. A method according to claim 1, wherein:
   said step (a) comprises forming said gate structure with a gate length of approximately 1 micron; and
   said step (b) comprises etching said aluminum layer of said gate structure to form said T-shaped gate electrode having a gate length of less than 0.75 microns.

6. A method according to claim 1, wherein said step (b) comprises etching with an etchant comprising NaOH and water in a ratio of approximately 1:40.

7. A method according to claim 1, further comprising the step of annealing the device at a temperature of at least 370° C. after said step (c) to form ohmic contacts between said source and drain electrodes and said substrate.

8. A method of fabricating a self-aligned semiconductor device on a substrate having an active region formed on the substrate and a highly doped layer formed on the active region, comprising the steps of:
(a) removing a selected portion of the highly doped layer to expose the active region;
(b) forming a multi-layer gate structure on the exposed portion of the active region having an aluminum first layer contacting said active region, a titanium second layer disposed on said aluminum first layer, and a platinum third layer disposed on said titanium second layer;
(c) selectively etching said aluminum first layer to form a gate electrode having a T-shaped cross-section; and
(d) forming source and drain electrodes on the highly doped layer using said T-shaped gate electrode as a shadow mask.

9. A method according to claim 8, wherein said step (b) comprises forming the aluminum first layer with a thickness of 3000–5000 Å, forming the titanium second layer with a thickness of at least 1000 Å, and forming the platinum third layer with a thickness of at least 1000 Å.

10. A method according to claim 8, wherein:
said step (b) comprises forming said gate structure having a gate length of approximately 1 micron; and
said step (c) comprises etcing said aluminum first layer of said gate structure to form said T-shaped gate electrode having a gate length of less than 0.75 microns.

11. A method according to claim 10, wherein said step (c) comprises etching with an etchant comprising sodium hydroxide (NaOH) and water in a ratio of approximately 1:40.

12. A method according to claim 8, wherein said step (a) comprises removing the selected portion of the highly doped layer by etching.

13. A method according to claim 8, further comprising the step of annealing the device at a temperature of at least 370° C. after said step (d) to form ohmic contacts between the source and drain electrodes and the highly doped layer.

* * * * *